United States Patent [19]
Mendel

[11] Patent Number: 5,691,653
[45] Date of Patent: Nov. 25, 1997

[54] PRODUCT TERM BASED PROGRAMMABLE LOGIC ARRAY DEVICES WITH REDUCED CONTROL MEMORY REQUIREMENTS

[75] Inventor: David Wolk Mendel, Sunnyvale, Calif.

[73] Assignee: Altera Corporation, San Jose, Calif.

[21] Appl. No.: 586,087

[22] Filed: Jan. 16, 1996

[51] Int. Cl.[6] .............................. H03K 19/94; H03K 7/38
[52] U.S. Cl. ................................ 326/39; 326/41
[58] Field of Search ......................... 326/39, 41

[56] References Cited

U.S. PATENT DOCUMENTS

| | | | |
|---|---|---|---|
| Re. 34,363 | 8/1993 | Freeman . | |
| 3,473,160 | 10/1969 | Wahlstrom | 340/172.5 |
| 3,949,370 | 4/1976 | Reyling, Jr. et al. | 326/39 |
| 4,124,899 | 11/1978 | Birkner et al. | 364/716 |
| 4,609,986 | 9/1986 | Hartmann et al. | 364/200 |
| 4,617,479 | 10/1986 | Hartmann et al. . | |
| 4,642,487 | 2/1987 | Carter . | |
| 4,677,318 | 6/1987 | Veenstra . | |
| 4,713,792 | 12/1987 | Hartmann et al. | 364/900 |
| 4,717,844 | 1/1988 | Shima et al. | 326/41 |
| 4,758,745 | 7/1988 | Elgamal et al. . | |
| 4,774,421 | 9/1988 | Hartmann et al. . | |
| 4,871,930 | 10/1989 | Wong et al. . | |
| 4,899,067 | 2/1990 | So et al. . | |
| 4,912,342 | 3/1990 | Wong et al. . | |
| 5,121,006 | 6/1992 | Pedersen . | |
| 5,220,214 | 6/1993 | Pedersen . | |
| 5,260,610 | 11/1993 | Pedersen et al. . | |
| 5,260,611 | 11/1993 | Cliff et al. . | |
| 5,274,581 | 12/1993 | Cliff et al. | 364/784 |
| 5,350,954 | 9/1994 | Patel . | |
| 5,371,422 | 12/1994 | Patel et al. | 326/41 |
| 5,530,378 | 6/1996 | Kucharewski, Jr. et al. | 326/41 |
| 5,610,535 | 3/1997 | Masaki et al. | 326/39 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

H. Fleisher et al., "An Introduction to Array Logic," IBM Journal of Research and Development, Mar. 1975, pp. 98–109.

A. Weinberger, "High–Speed Programmable Logic Array Adders," IBM Journal of Research and Development, vol. 23, No. 2, Mar. 1979, pp. 163–178.

*Primary Examiner*—Edward P. Westin
*Assistant Examiner*—Richard Roseen
*Attorney, Agent, or Firm*—Fish & Neave; Robert R. Jackson

[57] ABSTRACT

The number of programmable control elements required in a programmable AND array for use in a product term based programmable logic array device is reduced by generally feeding only the true or complement of each input logic signal into the AND array on an associated main word line conductor. Auxiliary word line conductors are provided for those input logic signals that are required in both true and complement form. The number of auxiliary word line conductors is less than the number of main word line conductors, which can reduce the required number of programmable control elements as compared to a conventional programmable AND array in which both the true and complement of all input logic signals are fed into the array.

7 Claims, 4 Drawing Sheets

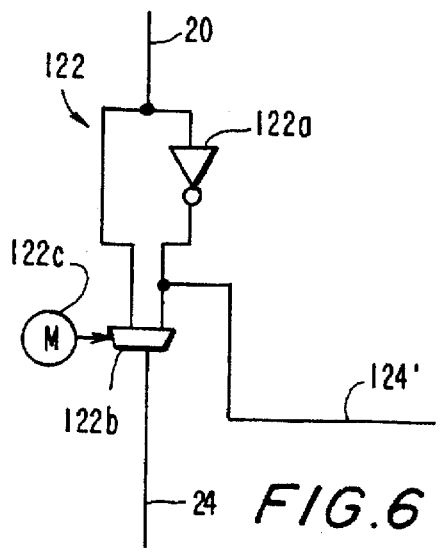
FIG.6
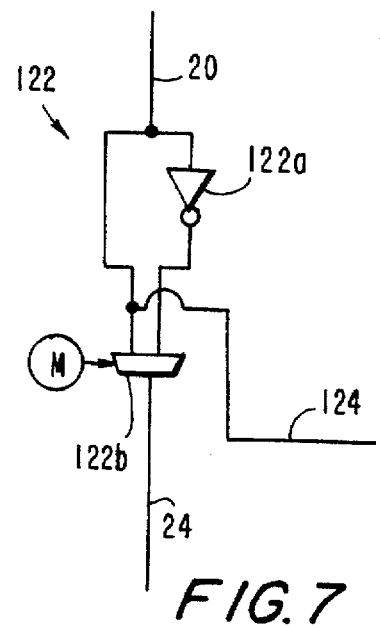
FIG.7
FIG.8
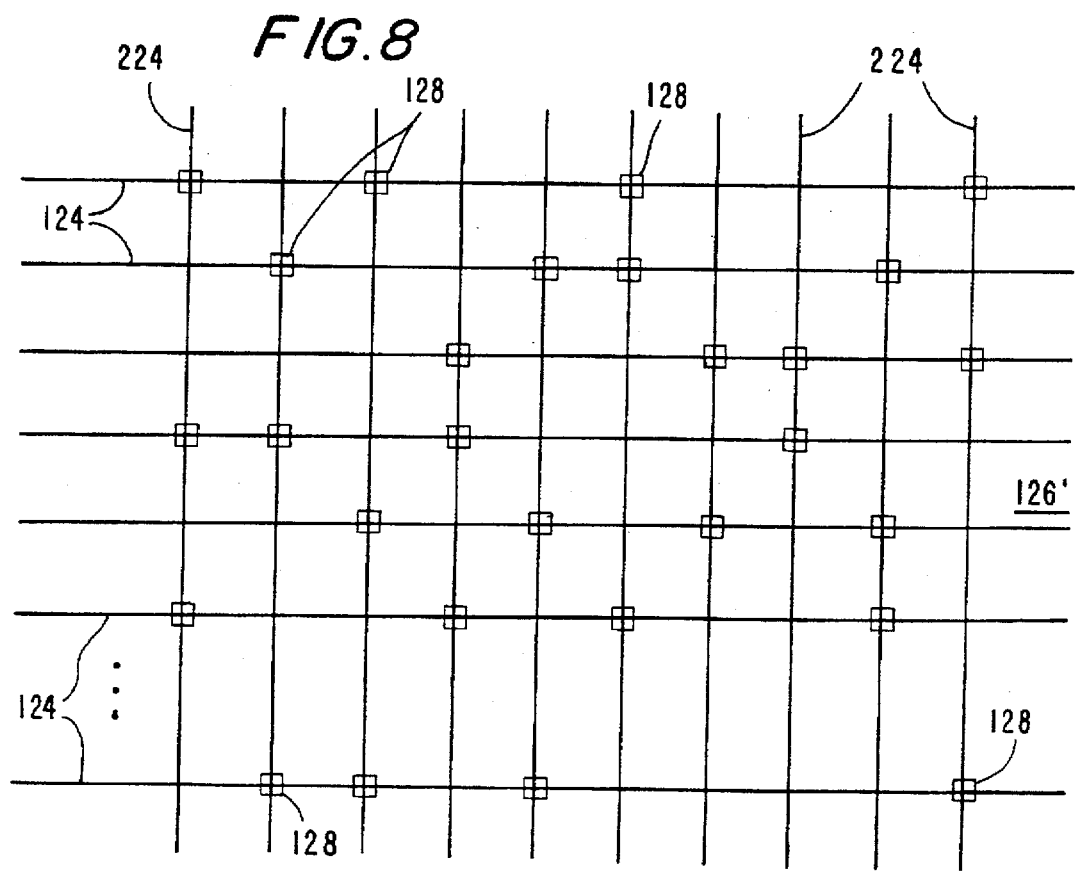

PRODUCT TERM BASED PROGRAMMABLE LOGIC ARRAY DEVICES WITH REDUCED CONTROL MEMORY REQUIREMENTS

BACKGROUND OF THE INVENTION

This invention relates to programmable logic array devices, and more particularly to programmable logic array devices of the type which employ product term logic.

Programmable logic array devices which employ product term logic are well known as shown, for example, by Wong et al. U.S. Pat. No. 4,871,930. Typically in such devices the true and complement of each of a large number of logic signals are fed into a programmable "AND array" via so-called "word line" conductors. Each of the word line conductors is programmably connectable to each of several "bit line", "product term", or "Pterm line" conductors in such a way that the signal on each Pterm line conductor is the logical AND of the signals on the word line conductors that are connected to the Pterm line conductor. This universal connectability of the true or complement of any input to any Pterm output requires a large number of programmable elements to control the programmable connections. For example, if there are i logic inputs and p product term outputs, there will be 2i word lines and 2ip programmable connections, each with an associated programmable control element (e.g., a random access memory ("RAM") cell). A typical AND array in a programmable logic array device may have 36 logic inputs and 80 Pterm outputs, leading to a requirement for 2×36×80=5760 programmable control elements for controlling the connections that can be made in the AND array. Moreover, there may be several such AND arrays in one programmable logic array integrated circuit device. It will thus be seen that a considerable amount of circuit resources must be devoted to providing the large numbers of programmable elements typically required for controlling the AND array(s) in Pterm-based programmable logic array devices.

In view of the foregoing, it is an object of this invention to provide improved Pterm-based programmable logic array devices.

It is a more particular object of this invention to reduce the number of programmable control elements required to control the connections made in the AND array(s) of Pterm-based programmable logic array devices.

SUMMARY OF THE INVENTION

These and other objects of the invention are accomplished in accordance with the principles of the invention by, in the case of all logic inputs, selectively feeding either the true or the complement of the logic input into the programmable AND array via an associated main word line conductor. In addition to the main word line conductors, a smaller number of auxiliary word line conductors are provided in the AND array. When both the true and complement of a logic input are needed, the one of these versions of the logic input that is not already provided on a main word line conductor is fed into the AND array on an auxiliary word line conductor. If the number of auxiliary word line conductors is sufficiently less than the number of main word line conductors, then the total number of programmable control elements can be significantly reduced.

Further features of the invention, its nature and various advantages will be more apparent from the accompanying drawings and the following detailed description of the preferred embodiments.

BRIEF DESCRIPTION OF THE DRAWINGS

FIG. 6 is a simplified schematic diagram of another alternative embodiment of circuitry of the type shown in FIG. 5a in accordance with this invention.

FIG. 7 is a simplified schematic diagram of still another alternative embodiment of circuitry of the type shown in FIGS. 5a and 6 in accordance with this invention.

FIG. 8 is a simplified schematic diagram of an illustrative alternative embodiment of a portion of the circuit of FIG. 3 in accordance with this invention.

DETAILED DESCRIPTION OF THE PREFERRED EMBODIMENTS

Figure 1:
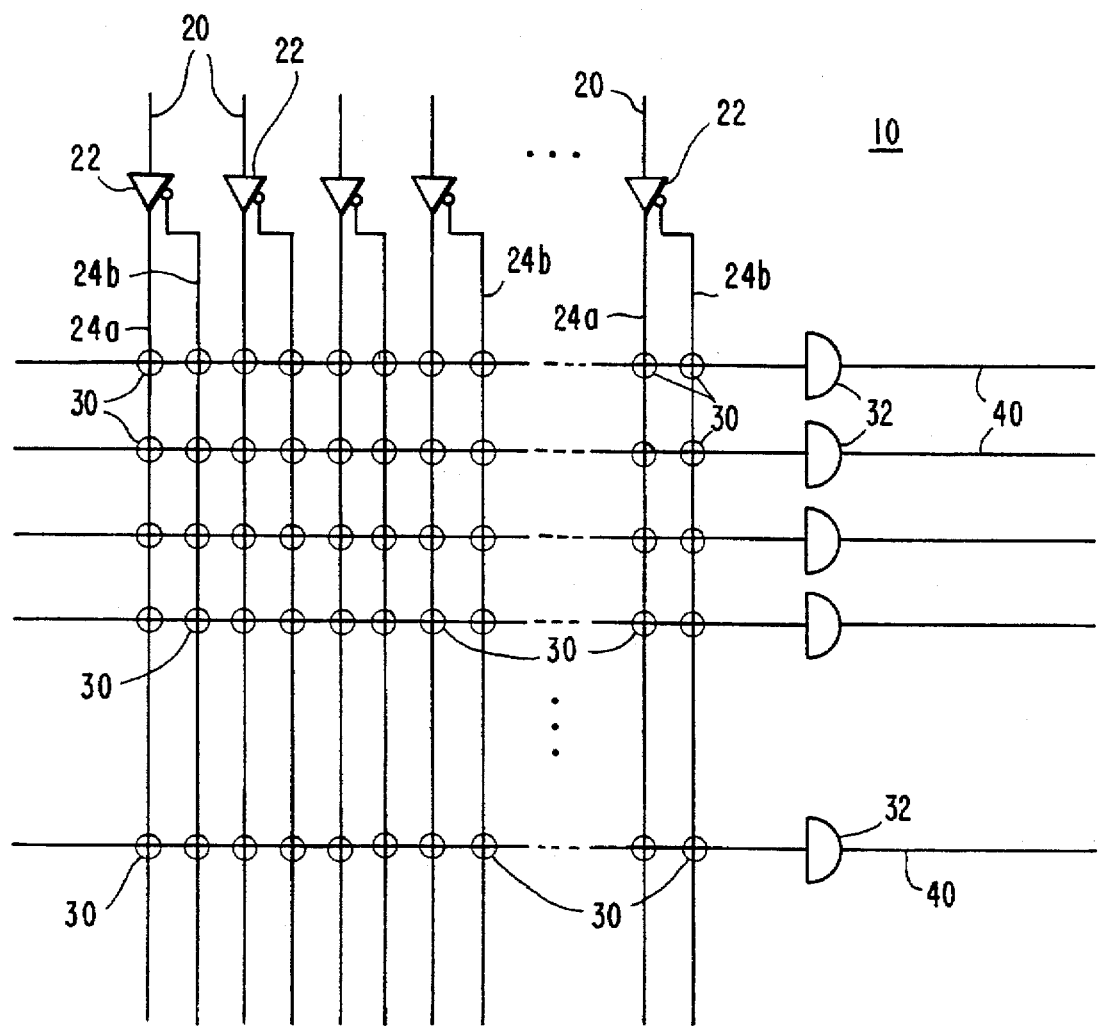
FIG. 1 is a simplified schematic diagram of an illustrative, conventional, programmable AND array circuit.

As shown in FIG. 1, a typical, conventional, programmable AND array 10 for a Pterm-based programmable logic array device has i logic input signal leads 20 and p Pterm output signal leads 40. Each input lead 20 is connected to a respective word line driver 22, which produces both true and complement versions of the input signal and respectively applies those versions to true and complement word line conductors 24a and 24b.

Each of word line conductors 24 is selectively connectable to each of Pterm line conductors 40 by a programmable connection 30. Connections 30 are such that the signal on each conductor 40 is the logical AND of the signals on the word lines 24 that are connected to that conductor 40. This is indicated schematically in the drawings by the AND gate 32 in each Pterm line conductor. Each connection 30 includes or is controlled by a programmable memory element (not shown separately in the drawings, but also sometimes referred to for convenience herein by the reference number 30).

From the foregoing it will be seen that programmable AND array 10 has 2ip connections 30, and therefore the same number of programmable memory elements 30. In general, however, only a subset of these connections will be used in any particular logic design.

Figure 2:
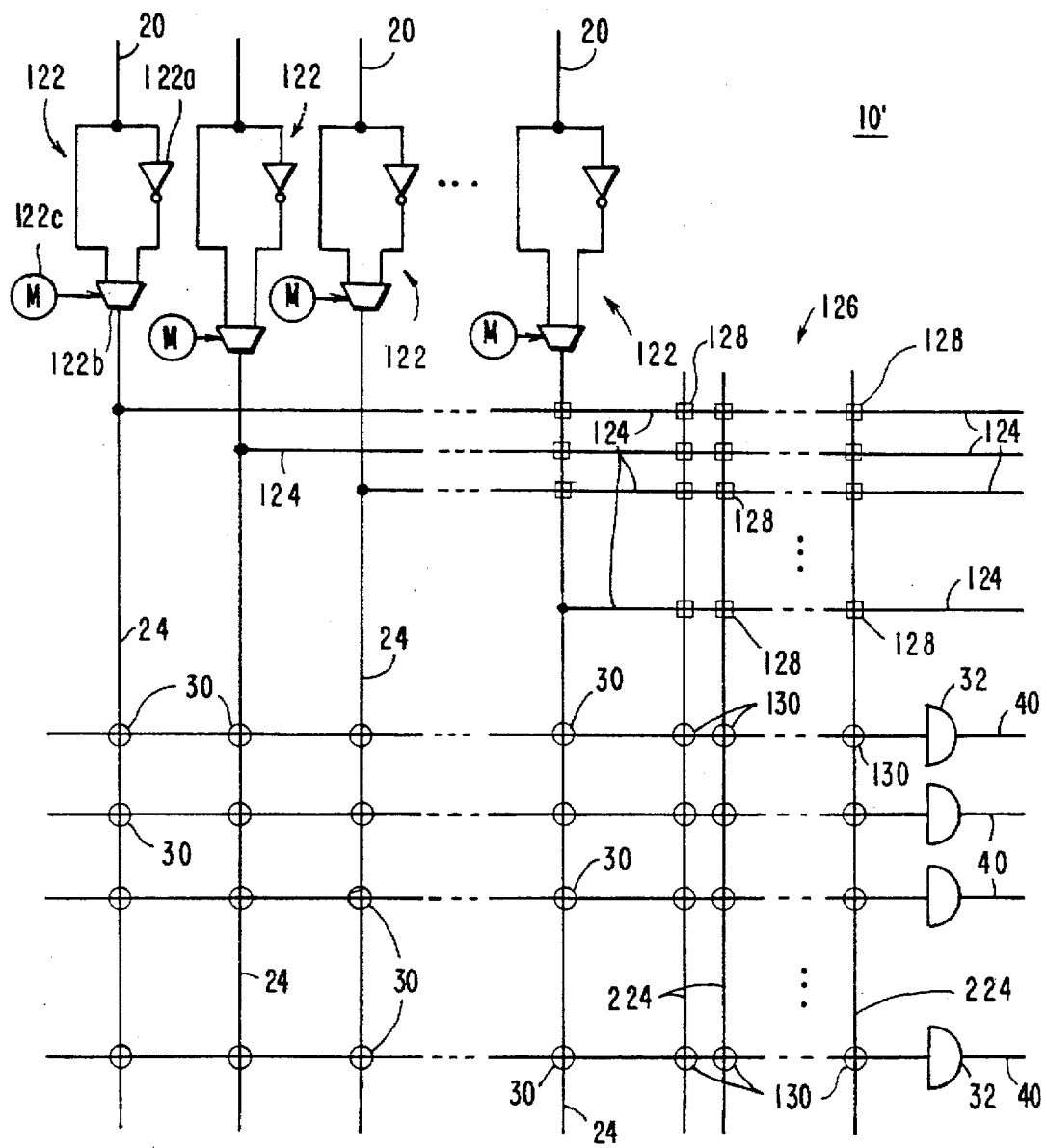
FIG. 2 is a simplified schematic diagram of an illustrative embodiment of a programmable AND array circuit constructed in accordance with this invention.

FIG. 2 shows a modified programmable AND array 10' in accordance with this invention which can reduce the required number of memory elements. In AND array 10' each of the i logic input signals 20 is applied to a respective programmable inverter circuit 122. Although programmable inverter circuits 122 can be constructed in other ways, in the depicted illustrative embodiment each circuit 122 includes an inverter 122a, a multiplexer 122b, and a programmable memory element 122c. Each multiplexer 122b is controlled by the associated memory element 122c to apply either the true or the complement version of the associated logic input 20 to an associated main word line conductor 24. (The complement version of each logic input 20 is produced by the associated inverter 122a.) As in conventional AND array 10, each main word line conductor is selectively connectable to each Pterm line conductor 40 by a programmable connection 30.

Each main word line conductor 24 has a branch 124 leading to a cross-point switch matrix 126. Switch matrix 126 has a plurality of programmable switches 128 for selectively connecting any one of branch conductors 124 to any one of auxiliary word line conductors 224. An illustrative embodiment of a representative switch 128 is shown in more detail in FIG. 3, where it will be seen that each such switch includes an inverter 128a and a tri-state driver 128b controlled by a memory element 128c. Inverter 128a inverts the signal on branch conductor 124 and applies the inverted signal to tri-state driver 128b. If turned on by the associated memory cell 128c, tri-state driver 128b applies the signal it receives to the associated auxiliary word line conductor 224. It will therefore be seen that each switch 128 can apply the complement of the signal on the associated main word line conductor 24 to any one of auxiliary word line conductors 224.

Figure 4:
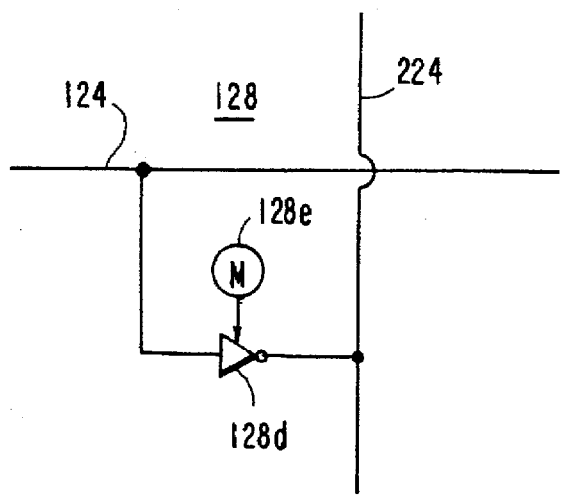
FIG. 4 is a simplified schematic diagram of an alternative embodiment of the circuit shown in FIG. 3 in accordance with this invention.

An alternative embodiment of switches 128 is shown in FIG. 4. In this alternative each switch 128 is an inverting tri-state driver 128d controlled by a programmable memory cell 128e. This embodiment may be preferred if the driver does not need to be too strong.

Returning to FIG. 2 auxiliary conductors 224 are programmably selectively connectable to Pterm line conductors 40 by programmable connections 130, which can be similar to programmable connections 30. Thus each connection 130 includes or is controlled by a programmable memory element (not shown, but sometimes referred to by the same reference number 130). Each Pterm output signal 40 is therefore the logical AND of the signals on the main 24 and/or auxiliary 224 word line conductors to which that Pterm line conductor is connected by connections 30 and/or 130.

When only the true or the complement of an input logic signal 20 is needed in AND array 10', the associated programmable inverter circuit 122 is programmed (by means of its memory element 122c) to apply the required true or complement signal to the associated main word line conductor 24. If both the true and complement of an input logic signal 20 are needed in AND array 10', then the associated programmable inverter circuit 122 is programmed (by means of its memory element 122c) to apply either the true or complement signal to the associated main word line conductor 24. In addition, one of switches 128 is enabled to apply the inverted form of the signal on the main word line conductor to an available one of auxiliary word line conductors 224, thereby making both the true and complement of the associated logic input 20 available in the AND array.

The number n of auxiliary word line conductors 224 can generally be substantially less than the number i of input logic signals 20 because only a subset of the input logic signals are typically needed in both true and complement form. If n is sufficiently less than i, then the total number N' of memory elements 122c, 30, 128c, and 130 in AND array 10' can be substantially less than the total number N of memory elements 30 in conventional AND array 10. N' is given by the formula N'=i+ip+ni+np, where the first term on the right is the number of memory elements 122c, the second term on the right is the number of memory elements 30, the third term on the right is the number of memory elements 128c, and the fourth term on the right is the number of memory elements 130. If i is 36, p is 80, and n is 16, then N' is 4772, which is approximately a 17% saving as compared to the 5760 memory elements 30 required by a conventional AND array 10 having the same numbers of inputs 20 and outputs 40. With these numbers of inputs and outputs, AND array 10' will save on memory elements as long as n is less than or equal to 24.

Figure 3:
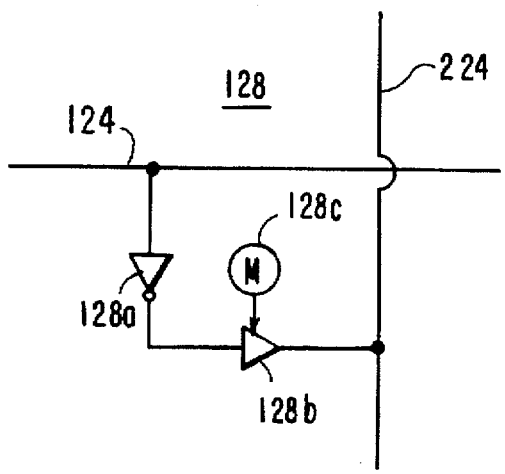
FIG. 3 is a more detailed, but still simplified, schematic diagram of a representative portion of the circuit of FIG. 3 in accordance with this invention.
Figure 5A:
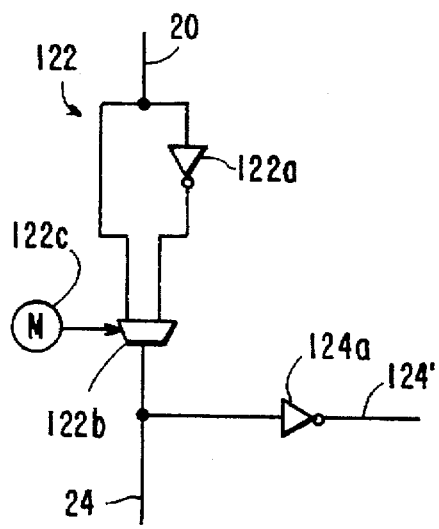
FIG. 5a is a simplified schematic diagram of an alternative embodiment of a representative portion of the circuit shown in FIG. 2 in accordance with this invention.
Figure 5B:
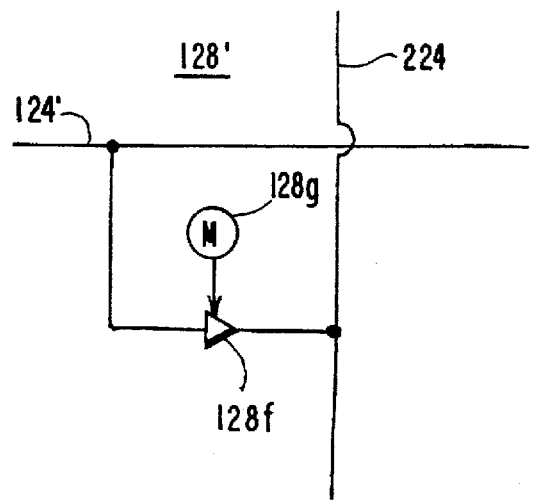
FIG. 5b is a simplified schematic diagram of another alternative embodiment of circuitry of the type shown in FIGS. 3 and 4 in accordance with this invention.

Another alternative to the embodiment shown in FIGS. 2 and 3 is illustrated by FIGS. 5a and 5b. As shown in FIG. 5a one inverter 124a is included in each line 124 (now designated 124') so that each switch 128 does not need its own inverter 128a as shown in FIG. 3. The simpler type of switch 128' shown in FIG. 5b can then be used in place of the switches 128 shown in FIG. 3. Each switch 128' includes a tri-state driver 128f controlled by a programmable memory element 128g to either make or not make a connection between the associated conductors 124' and 224.

Still another alternative to the embodiment shown in FIGS. 2 and 3 is illustrated by FIG. 6 (in conjunction with FIG. 5b). In this alternative each conductor 124' (logically equivalent to conductor 124' in FIG. 5a) is connected directly to the output of the inverter 122a in the associated programmable inverter circuit 122. This eliminates the need for another inverter (124a in FIG. 5a) in conductor 124'. The circuitry shown in FIG. 6 is usable with programmable switches of the type shown in FIG. 5b. An operational difference between this and the previously described embodiments is that in this embodiment, when both the true and complement of an input signal 20 are required in the AND array, a main word line conductor 24 must carry the true signal and an auxiliary word line conductor 224 must carry the complement. This constraint is so minor, however, that it is generally of no consequence.

If it is preferred to use inverting switches 128 of the type shown in FIG. 3 or FIG. 4 with a construction of the general type shown in FIG. 6, then the alternative shown in FIG. 7 can be used in place of the FIG. 6 circuitry. In FIG. 7 each conductor 124 is connected directly to the true input of the associated programmable inverter circuit 122. This embodiment again has a minor operational constraint in that when both the true and complement of an input 20 are required in the AND array, the true signal must be on the associated main word line conductor 24 and the complement signal must be on an auxiliary word line conductor 224. As in the embodiment of FIGS. 6 and 5b, however, this constraint is generally of no consequence.

The total number of memory elements required in AND array 10' may be reducible even further by using a partly populated cross-point switch matrix in place of the fully populated cross-point switch matrix 126 shown in FIG. 2. For example, FIG. 8 shows an illustrative partly populated cross-point switch matrix 126' in which each branch conductor 124 is connectable to any one of four auxiliary word line conductors 224 by programmable switches 128. (As in connection with FIG. 2, elements 124 and 128 in FIG. 8 can be alternative elements 124' and 128' if desired. In other words, the modification shown in FIG. 8 can be used with any of the embodiments that are described above.) Switches 128 are preferably distributed substantially uniformly among auxiliary word line conductors 224 and in a pattern which minimizes the potential for blocking of needed access to conductors 224 by inputs 20. If cross-point switch 126' (with four possible connections from each main word line to auxiliary word lines) is used in place of cross-point switch 126 in FIG. 2, then the number N" of required programmable memory elements is given by the formula N"=i+ip+4i+np, where the variables i, p, and n are as described above. N" will be less than N' as long as n is greater than 4. Using the variable values from the preceding example, N" is 4340, which is more than a 24% saving as compared to AND array 10 with the same numbers of inputs and outputs 20 and 40.

It will be understood that the foregoing is only illustrative of the principles of the invention, and that various modifications can be made by those skilled in the art without departing from the scope and spirit of the invention. For example, the particular forms shown for circuits 122 and 128 are only illustrative, and these circuit functions can be implemented in other ways if desired. The partial population density shown in FIG. 4 is only illustrative, and any other partial population density may be used if desired. It will also be appreciated that the invention is applicable to many different circuit fabrication technologies. Thus the programmable memory elements (e.g., 30, 130, etc.) can be any of a wide variety of types such as SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like.

The invention claimed is:

1. A logic array circuit having a plurality of input logic signal leads and a plurality of output logic signal leads, said logic array circuit comprising:

a plurality of main word line conductors;

a plurality of auxiliary word line conductors;

circuitry for programmably selectively connecting any of said main and auxiliary word line conductors to each of said output logic signal leads so that the signal on each said output logic signal lead is a logical function of signals on the main and auxiliary word line conductors to which that output logic signal lead is connected;

programmable inversion circuitry associated with each of said input logic signal leads for programmably selectively applying to a respective one of said main word line conductors the true or complement of the signal on said input logic signal lead; and programmable switching circuitry for programmably selectively applying to an auxiliary word line conductor the inverse of the signal applied to a main word line conductor when the logic array circuit requires both the true and complement of the signal on that main word line conductor.

2. The apparatus defined in claim 1 wherein said plurality of auxiliary word line conductors includes substantially fewer conductors than said plurality of main word line conductors.

3. The apparatus defined in claim 1 wherein said programmable switching circuitry comprises:

a plurality of programmable switches associated with each of said main word line conductors for programmably selectively applying the inverse of the signal applied to that main word line conductor to any of said auxiliary word line conductors.

4. The apparatus defined in claim 1 wherein said programmable switching circuitry comprises:

a plurality of programmable switches associated with each of said main word line conductors for programmably selectively applying the inverse of the signal applied to that main word line conductor to any of a subplurality of said auxiliary word line conductors, said subplurality being less than all of said auxiliary word line conductors.

5. The apparatus defined in claim 1 wherein said programmable inversion circuitry associated with each of said input logic signal leads comprises:

an inverter for inverting the signal on the associated input logic signal lead;

a switch for selecting either the signal on the associated input logic signal lead or the inverted signal produced by said inverter as the signal applied to the respective one of said main word line conductors; and a programmable memory element for controlling said switch.

6. The apparatus defined in claim 3 wherein each of said programmable switches comprises:

a tri-state driver for selectively applying to an auxiliary word line conductor the inverse of the signal applied to the main word line conductor that is associated with that programmable switch; and a programmable memory element for controlling said tri-state driver.

7. The apparatus defined in claim 4 wherein each of said programmable switches comprises:

a tri-state driver for selectively applying to an auxiliary word line conductor the inverse of the signal applied to the main word line conductor that is associated with that programmable switch; and a programmable memory element for controlling said tri-state driver.

* * * * *